(12) United States Patent
Uchida

(10) Patent No.: US 8,569,854 B2
(45) Date of Patent: *Oct. 29, 2013

(54) SEMICONDUCTOR IMAGING INSTRUMENT AND MANUFACTURING METHOD THEREOF, AND CAMERA AND MANUFACTURING METHOD THEREOF

(75) Inventor: Yoshinori Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/347,418

(22) Filed: Jan. 10, 2012

(65) Prior Publication Data

US 2012/0104527 A1    May 3, 2012

Related U.S. Application Data

(60) Continuation of application No. 12/585,476, filed on Sep. 16, 2009, now Pat. No. 8,093,093, which is a division of application No. 11/542,151, filed on Oct. 4, 2006, now Pat. No. 7,605,438.

(30) Foreign Application Priority Data

Nov. 14, 2005 (JP) ................................ P2005-329123

(51) Int. Cl.
*H01L 21/00* (2006.01)

(52) U.S. Cl.
USPC .................. 257/432; 257/435; 257/E31.121; 257/E31.122; 438/70

(58) Field of Classification Search
USPC .................. 257/432, 435, E31.121, E31.122; 348/294, E5.091; 438/70
See application file for complete search history.

(56) References Cited

U.S. PATENT DOCUMENTS

| 4,808,501 A * | 2/1989 | Chiulli ............................. 430/7 |
| 6,383,864 B2 | 5/2002 | Scheller et al. |
| 6,383,894 B1 | 5/2002 | Wester |
| 6,532,120 B1 * | 3/2003 | Harada et al. ................. 359/885 |
| 6,878,960 B2 * | 4/2005 | Yokoyama et al. ............ 257/40 |
| 7,498,123 B2 * | 3/2009 | Cahill ........................... 430/339 |
| 2002/0063214 A1 * | 5/2002 | Hsiao et al. ................. 250/338.4 |
| 2005/0205903 A1 * | 9/2005 | Hioki ............................ 257/291 |
| 2006/0043260 A1 | 3/2006 | Ma et al. |
| 2006/0073407 A1 | 4/2006 | Yamanobe et al. |
| 2007/0045517 A1 * | 3/2007 | Fukuyoshi et al. ......... 250/208.1 |
| 2010/0051967 A1 * | 3/2010 | Bradley et al. ................. 257/80 |

FOREIGN PATENT DOCUMENTS

| JP | 59229863 A | * 12/1984 |
| JP | 63-73204 A | 4/1988 |
| JP | 2000-121807 A | 4/2000 |
| JP | 2003-222719 A | 8/2003 |
| JP | 2004-200360 A | 7/2004 |
| JP | 2005-223242 A | 8/2005 |

* cited by examiner

*Primary Examiner* — Allan R Wilson
(74) *Attorney, Agent, or Firm* — Rader, Fishman & Grauer PLLC

(57) ABSTRACT

A semiconductor imaging instrument is disclosed, including a prescribed substrate, an imaging device array provided on the substrate and having plural semiconductor imaging devices and electrodes for outputting a signal charge upon photoelectric conversion of received light, and a color filter layer provided on the imaging device array, with an infrared light absorbing dye being contained in the color filter layer.

17 Claims, 10 Drawing Sheets

FORMATION EXAMPLE (NO. 6) OF SEMICONDUCTOR IMAGING INSTRUMENT 100

STRUCTURAL EXAMPLE OF SEMICONDUCTOR
IMAGING INSTRUMENT 100 AS EMBODIMENT

STRUCTURAL EXAMPLE OF SOLID-STATE
IMAGING DEVICE pij OF ONE PIXEL

SPECTRAL CHARACTERISTIC OF EACH OF COLOR FILTER (LAYER) OF EMBODIMENT OF INVENTION AND THAT OF COMPARATIVE EXAMPLE

FORMATION EXAMPLE (NO. 2) OF
SEMICONDUCTOR IMAGING INSTRUMENT 100

FORMATION EXAMPLE (NO. 5) OF
SEMICONDUCTOR IMAGING INSTRUMENT 100

FORMATION EXAMPLE (NO. 6) OF SEMICONDUCTOR IMAGING INSTRUMENT 100

SEMICONDUCTOR IMAGING INSTRUMENT AND MANUFACTURING METHOD THEREOF, AND CAMERA AND MANUFACTURING METHOD THEREOF

CROSS REFERENCES TO RELATED APPLICATIONS

This is a Continuation Application of application Ser. No. 12/585,476, filed Sep. 16, 2009, now U.S. Pat. No. 8,093,093, which is a Divisional Application of application Ser. No. 11/542,151, filed Oct. 4, 2006, now U.S. Pat. No. 7,605,436, which contains subject matters related to Japanese Patent Application JP 2005-329123 filed in the Japan Patent Office on Nov. 14, 2005, the entire contents of which being incorporated herein by reference.

BACKGROUND OF THE INVENTION

1. Field of the Invention

The invention relates to a semiconductor imaging instrument which is suitably applied to, for example, a digital camera provided with a solid-state imaging device or a field effect imaging device each having light receiving sensitivity to not only visible light but also infrared light and a manufacturing method thereof and to a camera and a manufacturing method thereof. In detail, by providing a color filter layer containing an infrared light absorbing dye on an imaging device array having plural semiconductor imaging devices and electrodes, the invention is able to realize an infrared light cutting function by this color filter layer and to provide low transmissibility of infrared light as required for an infrared light cutting function in addition to high transmissibility of visible light as required for a color filter function.

2. Description of the Related Art

In recent years, video cameras and digital still cameras have been frequently used in schools, homes, broadcasting stations, and so on. In these cameras, a semiconductor imaging instrument is indispensable. In the semiconductor imaging instrument, in a solid-state imaging device or a field effect imaging device, CCD (charge coupled device) imaging devices as a photoelectric conversion device are two-dimensionally arranged, and light is introduced into the charge coupling device by a microlens or the like. The "CCD imaging device" referred to herein means a semiconductor device having a structure in which unit devices made of a photodiode, an MOS capacitor, etc. are regularly arranged. The semiconductor imaging instrument has a function to move a certain group of charges as stored on a surface of a semiconductor substrate along the line of electrodes of the MOS capacitor.

A solid-state imaging device of this kind, for example, CCD and CMOS image sensors, has sensitivity in an infrared light region. In a camera using this solid-state imaging device, in many cases, a filter for cutting infrared light is mounted on a camera optical system for the purpose of precisely separating the color.

Recently, miniaturization of digital cameras has been advancing. However, since the filter for cutting infrared light has a thickness of from approximately 1 to 3 mm, the thickness of the filter is a problem in view of thinning digital camera. In particular, in a camera module to be mounted in a mobile phone handset, a portable terminal, or the like, thinning of the optical system is essential.

In relation to such a filter for cutting infrared light, JP-A-2004-200360 (Patent Document 1) discloses a solid-state imaging device and a manufacturing method thereof. According to this manufacturing method of a solid-state imaging device, a microlens provided with an infrared light absorbing function and a flattening layer are formed on a photoelectric conversion device formed on a desired substrate. It is said that by employing such a manufacturing method, an external filter for cutting infrared light becomes unnecessary, the condensing properties can be improved, an S/N ratio can be improved, and the image quality can be enhanced.

SUMMARY OF THE INVENTION

However, according to Patent Document 1, besides the formation process of a solid-state imaging device, a manufacturing process for forming a filter layer for cutting infrared light must be added. Accordingly, because of increases in the operating time and materials to be used in a semiconductor wafer process, the costs of a semiconductor imaging instrument may possibly become high.

Thus, it is desired to provide a semiconductor imaging instrument provided with a color filter layer containing an infrared light absorbing dye on an imaging device array having semiconductor imaging devices and electrodes, which is able to realize an infrared light cutting function by this color filter layer and to possess low transmissibility of infrared light as required for an infrared light cutting function in addition to high transmissibility of visible light as required for a color filter function and a manufacturing method of the semiconductor imaging instrument and a camera and a manufacturing method thereof.

According to an embodiment of the invention, there are provided a semiconductor imaging instrument and a camera, each of which includes a prescribed substrate, an imaging device array provided on the substrate and having plural semiconductor imaging devices and electrodes for outputting a signal charge upon photoelectric conversion of received light, and a color filter layer provided on the imaging device array, with an infrared light absorbing dye being contained in the color filter layer.

In a semiconductor imaging instrument and a camera according to this embodiment of the invention, an imaging device array having plural semiconductor imaging devices and electrodes is provided on a prescribed substrate and outputs a signal charge upon photoelectric conversion of received light. A color filter layer containing an infrared light absorbing dye is provided on this imaging device array.

Accordingly, since the color filter layer can be provided with an infrared light cutting function, a semiconductor imaging instrument and a camera, each of which possesses low transmissibility of infrared light as required for an infrared light cutting function in addition to high transmissibility of visible light as required for a color filter function, can be provided.

According to an embodiment of the invention, there is a manufacturing method of a semiconductor imaging instrument and a camera, which includes forming an imaging device array having plural semiconductor imaging devices and electrodes on a prescribed substrate and forming a color filter layer containing an infrared light absorbing dye on the imaging device array as formed on the substrate.

In the manufacturing method of a semiconductor imaging instrument and a camera according to this embodiment of the invention, a color filter function-provided semiconductor imaging instrument and a camera, each of which is provided with low transmissibility of infrared light as required for an infrared light cutting function in addition to high transmissibility of visible light as required for a color filter function, can be manufactured.

In the semiconductor imaging instrument and the camera according to the embodiments of the invention, a color filter layer is provided on an imaging device array as provided on a substrate having plural semiconductor imaging devices and electrodes, and this color filter layer contains an infrared light absorbing dye.

By this configuration, since the color filter layer can be provided with an infrared light cutting function, a semiconductor imaging instrument and a camera, each of which possesses low transmissibility of infrared light as required for an infrared light cutting function in addition to high transmissibility of visible light as required for a color filter function, can be provided. In this way, it becomes unnecessary to use an infrared light cutting filter having a thickness of from approximately 1 to 3 mm as a camera member, so that this largely contributes to the miniaturization of a camera.

In the manufacturing method of a semiconductor imaging instrument and a camera according to the embodiments of the invention, after forming an imaging device array having plural semiconductor imaging devices and electrodes on a prescribed substrate, a color filter layer containing an infrared light absorbing dye is formed on the imaging device array.

By this configuration, a color filter function-provided semiconductor imaging instrument and a camera, each of which is provided with low transmissibility of infrared light as required for an infrared light cutting function in addition to high transmissibility of visible light as required for a color filter function, can be manufactured. In addition, formation process of an infrared light cutting filter layer that is formed separately from the color filter layer can be omitted. Thus, it becomes possible to design to shorten the operation time in a semiconductor wafer process and to reduce the materials to be used, thereby lowering the manufacturing costs.

DETAILED DESCRIPTION OF THE PREFERRED EMBODIMENTS

Next, embodiments of a semiconductor imaging instrument and a manufacturing method thereof and a camera and a manufacturing method thereof according to embodiments of the invention will be hereunder described with reference to the accompanying drawings.

(1) Semiconductor Imaging Instrument and Camera

Figure 1:
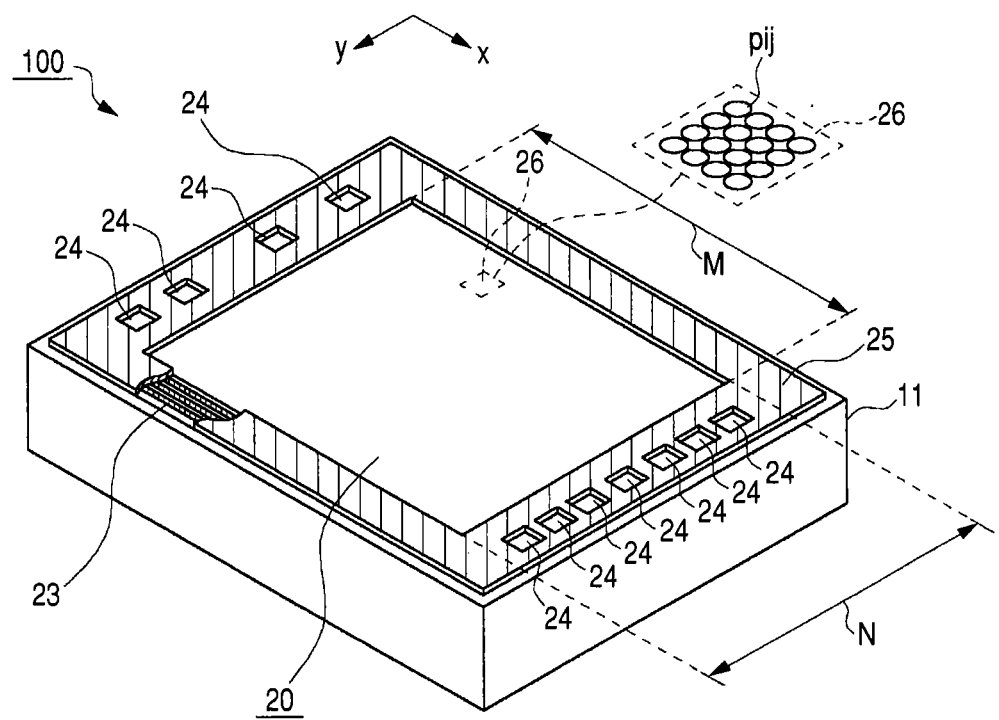
FIG. 1 is a partially exploded perspective view showing a structural example of a semiconductor imaging instrument 100 as an embodiment according to the invention.

FIG. 1 is a partially exploded perspective view showing a structural example of a semiconductor imaging instrument 100 as an embodiment according to the invention.

In this embodiment, by providing a color filter layer containing an infrared light absorbing dye on an imaging device array having plural semiconductor imaging devices and electrodes, not only an infrared light cutting function can be realized by this color filter layer, but also low transmissibility of infrared light as required for an infrared light cutting function in addition to high transmissibility of visible light as required for a color filter function can be provided.

A semiconductor imaging instrument 100 as illustrated in FIG. 1 is suitably applied to a solid-state imaging device or a field effect imaging device, each having light receiving sensitivity to not only visible light but also infrared light. This semiconductor imaging instrument 100 has a silicon substrate 11 as one example of the prescribed substrate. This silicon substrate 11 is provided with a sensor part 20 as one example of the imaging device array. The sensor part 20 has a plurality of solid-state imaging devices pij (i=1 to M, j=1 to N) as one example of the semiconductor imaging device and outputs a signal charge upon photoelectric conversion of received light. The solid-state imaging device pij has photodiodes in the number of (M×N) and is arranged in a matrix state of M pixels in a line direction x and N pixels in a row direction y.

In a peripheral region of this sensor part 20, a wiring part 23 for a peripheral circuit (hereinafter referred to as "peripheral wiring part") and electrode parts 24 for connection (hereinafter referred to as "bonding pad parts") are provided. The peripheral wiring part 23 is connected to the bonding pad parts 24. In this example, an anti-flare film 25, marked with oblique lines in the drawing, is provided in a portion excluding the foregoing sensor part 20 and bonding pad parts 24 and functions to prevent a flare.

Figure 2:
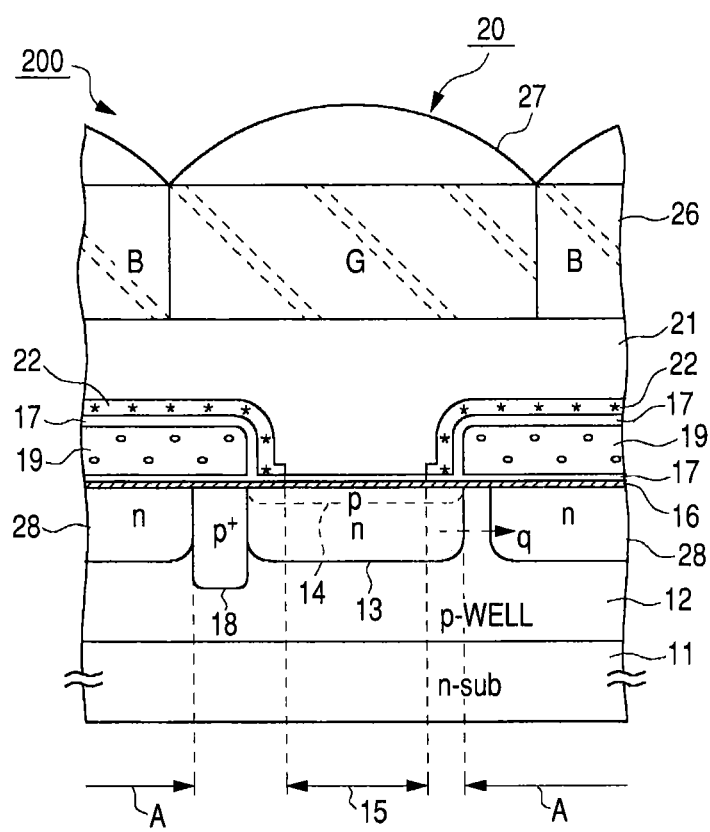
FIG. 2 is a cross-sectional view showing a structural example of a solid-state imaging device pij of one pixel of a semiconductor imaging instrument 100.

Next, the solid-state imaging device pij of one pixel of the sensor part 20 surrounded by the anti-flare film 25 will be described below. FIG. 2 is a cross-sectional view showing a structural example of the solid-state imaging device pij of one pixel of the semiconductor imaging instrument 100.

The solid-state imaging device pij as illustrated in FIG. 2 has, for example, an n-type silicon substrate (n-sub) 11. This n-type silicon substrate 11 is provided with a p-type implant layer 12 (hereinafter referred to as "p-WELL"). The p-WELL 12 is formed by diffusing p-type impurities on the n-type silicon substrate 11 over a wide range.

This p-WELL 12 is provided with a channel stopper 18. In this example, the channel stopper 18 is configured to have a $p^+$-type impurity region. In the sensor part 20, for the purpose of configuring a pnpn joining device (photodiode PD), the p-WELL 12 of the silicon substrate 11 is provided with an n-type impurity region 13. A $p^+$-type impurity region 14 is joined on this n-type impurity region 13. An upper portion of this $p^+$-type impurity region 14 works as a light receiving window part 15.

On the silicon substrate 11 provided with the sensor part 20 and a charge transfer region, electrodes 19 for charge transfer are provided via a gate insulating film 16. An upper part and a side part of each of the electrodes 19 for charge transfer are insulated by an insulating film 17 made of, for example, $SiO_2$. An n-type impurity region 28 is provided in the silicon substrate 11 beneath each of the electrodes 19 and works so as to configure a vertical transfer (CCD) resistor.

The insulating film 17 is provided on each of the electrodes 19, and a shading film 22 made of, for example, aluminum is covered on this insulating film 17, thereby preventing the generation of noises called "smear". An insulating flattening layer 21 is provided on this shading film 22, and the foregoing light receiving window part 15 partitions the flattening layer 21 and the shading film 22 by an opened portion.

Furthermore, a color filter layer 26 containing an infrared light absorbing dye is provided on the flattening layer 21. For example, the color filter layer 26 functions to transmit red (R) light therethrough among received lights. Another color filter layer 26 functions to transmit green (G) light therethrough among received lights. Still another color filter layer 26 functions to transmit blue (B) light therethrough among received lights. On the foregoing color filter layer 26 containing an infrared light absorbing dye, a substantially hemispherical on-chip lens (microlens) 27 made of, for example, an acrylic resin is provided and works to execute image formation of the received lights in the light receiving window part 15.

Figure 3:
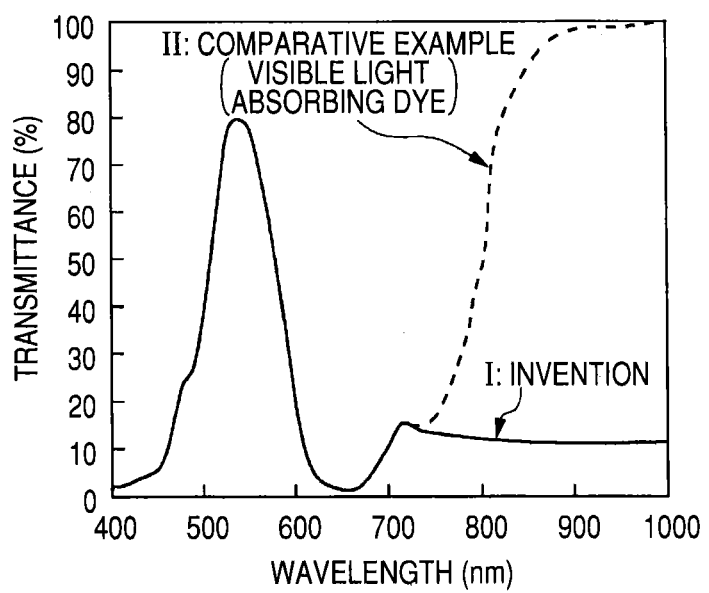
FIG. 3 is a graph showing a spectral characteristic of each color filter (layer) of an embodiment according to the invention and that of its comparative example.

In this embodiment, the color filter layer 26 contains an infrared light absorbing dye. In the color filter layer 26, a mixture in which a visible light absorbing dye material and an infrared light absorbing dye material are dispersed in a prescribed proportion in a desired resist material is used. As the visible light absorbing dye material, for example, a pigment having a spectral characteristic as shown in FIG. 3 is used. This pigment is a pigment which has hitherto been used in dye dispersed photoresists.

In this semiconductor imaging instrument 100, for example, in the case where a transmittance of infrared light of the color filter layer 26 is controlled to not more than 5%, a material composition ratio of the dye dispersed photoresist is as follows. As a matter of course, the transmittance of not more than 5% is a standard at which the effects can be expected.

Negative working photoresist: 50 wt %
Visible light absorbing dye: 25 wt %
Infrared light absorbing dye: 25 wt %

In this example, the dye dispersed photoresist is formed by adding these dyes in the negative working photoresist according to the foregoing material composition ratio. For the infrared light absorbing dye material, a cyanine based dye, namely, a dye which is configured by the following formula (1) is useful:

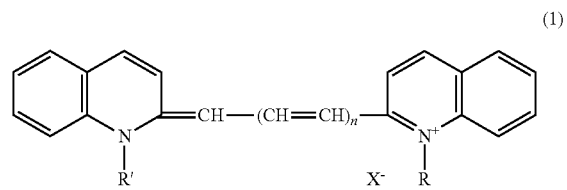

(1)

The cyanine dye as referred to herein is a general term of a dye having a cation structure in which two nitrogen-containing heterocyclic rings are bound to each other via a methine group —CH= or its chain. Examples of the heterocyclic ring which can be the subject include benzoxazole, benzothiazole, and monocyclic pyridine in addition to the quinoline of the formula (1). The binding position of the methine group is not limited to that in the formula (1). Incidentally, when n=0, the compound is a cyanine; when n=1, the compound is a carbocyanine; and when n=2, the compound is a dicarbocyanine.

R and R' each represents an alkyl or an alkoxy. In this example, R and R' are each $(CH_3)_2$. $X^-$ represents a halogen anion, and in this example, $X^-$ is $ClO_4^-$. When this is applied in the formula (1), the dye is represented by the following formula (2).

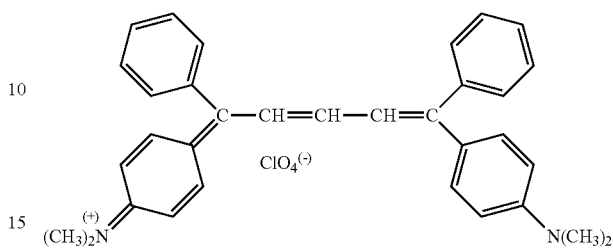

(2)

As a matter of course, the dye is not limited thereto, but a squalium based dye represented by the following formula (3) may be used (see D. J. Gravesteijn, et al., *Optical Storage Media SPIE*-420, page 327, 1983):

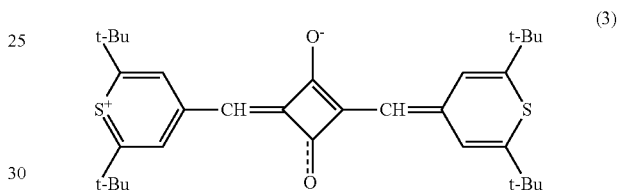

(3)

Incidentally, any base material containing an infrared light absorber is useful even when it is non-photosensitive. As the photosensitive resin, positive working resist materials may be used too.

Next, the spectral characteristic of the color filter layer 26 will be described below. FIG. 3 is a graph showing a spectral characteristic of each of a color filter (layer) of an embodiment according to the invention and that of its comparative example.

In FIG. 3, an abscissa stands for a wavelength λ [nm] of filter transmitted light and an ordinate stands for a transmittance [%] of a color filter. In the drawing, a solid line I represents a spectral characteristic of the color filter (layer) of the embodiment according to the invention and a broken line II represents a spectral characteristic of a color filter to which only a visible light absorbing dye is applied as a comparative example.

As a spectral characteristic of a color filter to which an infrared light absorbing dye is applied, it is ideal that the color filter does not have absorption in a visible light region of a wavelength of from 400 to 700 nm, whereas it has absorption in an infrared light region of a wavelength of from 700 to 1,000 nm. According to the color filter to which only a visible light absorbing dye is applied as the comparative example II, the infrared light is not absorbed but transmitted in an infrared light region of a wavelength of from 700 to 1,000 nm.

On the other hand, according to the spectral characteristic of the color filter layer 26 to which a visible light absorbing dye material and an infrared light absorbing dye material are applied as an embodiment of the invention, the transmittance in an infrared light region of a wavelength of from 700 to 1,000 nm is not more than 5%, as shown in FIG. 3.

Next, an operation example of the semiconductor imaging instrument 100 provided with the color filter layer 26 will be described below. According to the semiconductor imaging instrument 100, when light is irradiated on the light receiving window part 15, this light transmits through the color filter layer 26 and is received by the photodiodes PD of the sensor part 20. At this time, in the infrared light which has been made incident into the color filter layer 26, the transmittance in the infrared light region is controlled to not more than 5% as shown in FIG. 3. The photodiodes PD take received visible light into the n-type impurity region 13 from the p-type impurity region 14 and photoelectrically converts the light within the n-type impurity region 13 to generate a signal charge q. The signal charge q is gathered in a shallow portion of the n-type impurity region 13.

When a pulse signal is applied to the electrodes 19 for charge transfer, the signal charge q is read out into the charge transfer region (vertical transfer resistor) from the n-type impurity region 13. An excessive charge passes through the p-WELL 12 from the n-type impurity region 13 and comes out into the silicon substrate 11. In this way, color signals R, G and B can be taken out.

In this way, according to the semiconductor imaging instrument 100 according to this embodiment of the invention, the sensor part 20 having the solid-state imaging device pij of N pixels×M pixels and the electrodes 19 for charge transfer is provided on the n-type silicon substrate 11 and photoelectrically converts the received light to output the signal charge q. On this imaging device array, the color filter layer 26 containing an infrared light absorbing dye is provided.

Figure 10:
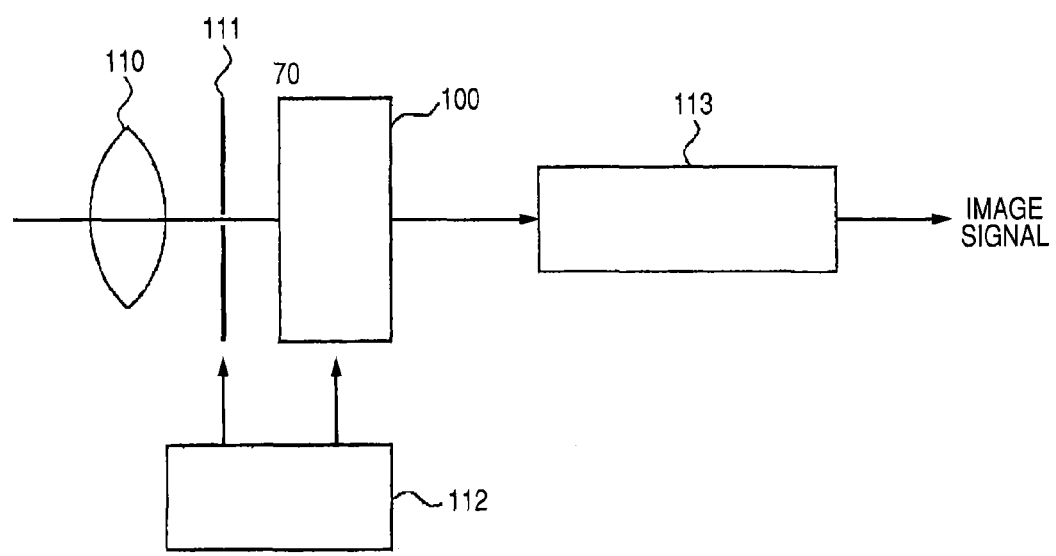
FIG. 10 is a view showing a structural example of a camera as an embodiment according to the invention.

FIG. 10 is a view showing a structural example of a camera as an embodiment according to the invention. The camera according to this embodiment is an example of a video camera capable of photographing a moving image.

The camera according to this embodiment has a semiconductor imaging instrument 100, an optical system 110, a shutter unit 111, a drive circuit 112, and a signal processing circuit 113.

The optical system 110 executes image formation of image light (incident light) from a subject on an imaging surface of the semiconductor imaging instrument 100. In this way, the signal charge is stored within the semiconductor imaging instrument 100 for a fixed period of time.

The shutter unit 111 controls a light irradiation period to the semiconductor imaging instrument 100 and a shading period.

The shutter instrument 111 feeds a drive signal, thereby controlling a transfer operation of the semiconductor imaging instrument 100 and a shutter operation of the shutter unit 111. By a drive signal (timing signal) as fed from the drive circuit 112, charge transfer of the semiconductor imaging instrument 100 is carried out. The signal processing circuit 113 executes various signal processings. An image signal that has been subjected to signal processing is stored in a recording medium, such as memories, or is outputted into a monitor.

Accordingly, since the color filter layer 26 can be provided with an infrared light cutting function, it is possible to provide the semiconductor imaging instrument 100 and the camera each having low transmissibility of infrared light as required for an infrared light cutting function in addition to high transmissibility of visible light as required for a color filter function. In this way, it becomes unnecessary to use an infrared light cutting filter having a thickness of from approximately 1 to 3 mm as a camera member so that this largely contributes to the miniaturization of a camera of a mobile phone handset, a portable terminal or the like.

(2) Manufacturing Method of Semiconductor Imaging Instrument and Camera:

In this embodiment, by dispersing an infrared light absorbing dye in a dye dispersed photoresist or a dye dispersed resin, it becomes possible to bring an infrared light cutting function to the color filter layer 26, thereby obtaining a desired optical characteristic without increasing the number of work processes and materials to be used. Examples of a method for forming the color filter layer 26 include (1) a method in which a dye dispersed photoresist (for example, a pigment dispersed type and a dye dispersed type) is formed by a photolithography technology; (2) a method in which a dye dispersed resin (for example, a pigment dispersed type and a dye dispersed type) is formed by photolithography and dry etching technologies; and (3) a method in which a transparent resin is formed by photolithography and then colored by a dyeing method.

In the following Examples, the case of manufacturing the semiconductor imaging instrument 100 having high light receiving sensitivity to visible light as compared with that to infrared light is premised. With respect to the sensor part 20, the case of the solid-state imaging device pij having the photodiodes PD is taken as an example. The case using the cyanine based dye represented by the formula (2), where the color filter layer 26 is formed by a dye dispersed photoresist, is employed as an example.

EXAMPLES

FIGS. 4 to 9 are each a process diagram of a formation example (Nos. 1 to 6) of the semiconductor imaging instrument 100 as the embodiment according to the invention.

Figure 4:
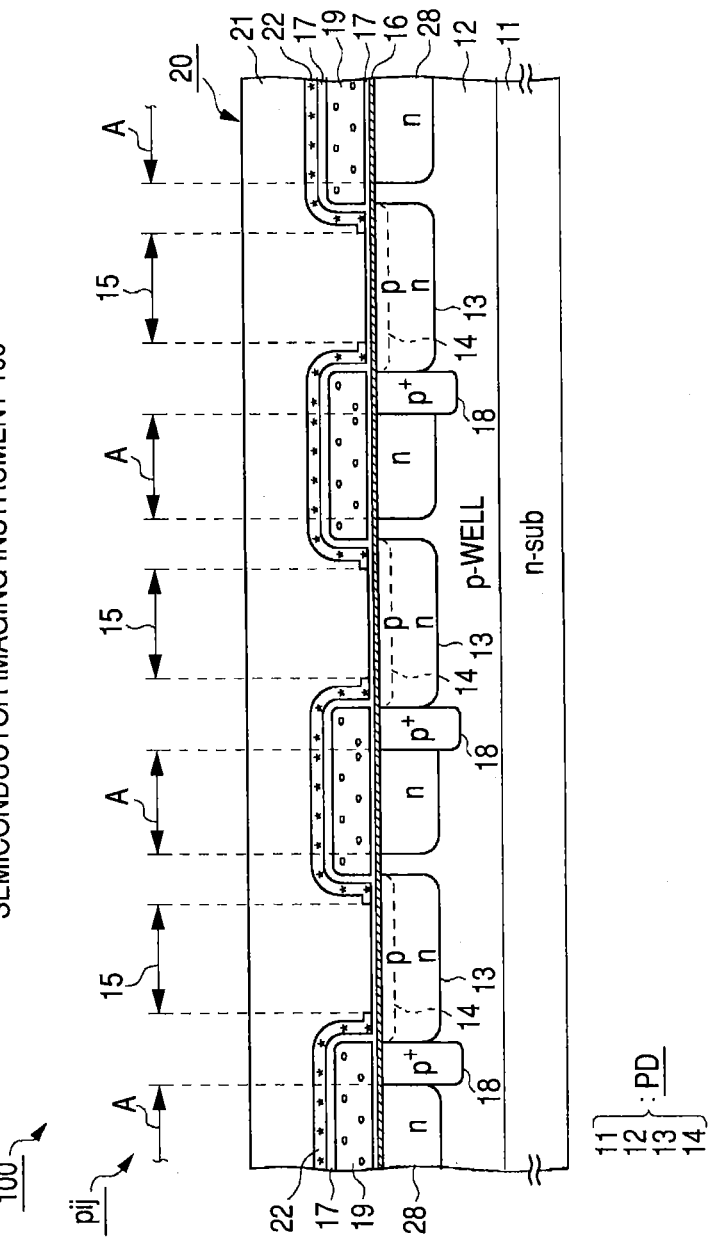
FIG. 4 is a process diagram of a formation example (No. 1) of a semiconductor imaging instrument 100 as an example according to the invention.

On the premise of the foregoing manufacturing condition, a sensor part 20 made of plural solid-state imaging devices pij is firstly formed on a silicon substrate 11 as illustrated in FIG. 4. An example, as illustrated in FIG. 4, is the case where in the sensor part 20, the solid-state imaging devices pij of three pixels adjacent to each other are formed on an n-type silicon substrate (n-sub) 11. This n-type silicon substrate 11 is provided with a p-type implant layer 12 (hereinafter referred to as "p-WELL"). The p-WELL 12 is formed by diffusing p-type impurities on the n-type silicon substrate 11 over a wide range.

This p-WELL 12 is provided with a channel stopper 18. In this example, the channel stopper 18 is configured to have a $p^+$-type impurity region 14. In the sensor part 20, for the purpose of configuring a pnpn joining device (photodiode PD), the p-WELL 12 of the silicon substrate 11 is provided with an n-type impurity region 13. The $p^+$-type impurity region 14 is joined on this n-type impurity region 13. An upper portion of this $p^+$-type impurity region 14 works as a light receiving window part 15.

On the silicon substrate 11 provided with the sensor part 20 and a charge transfer region, electrodes 19 for charge transfer are provided via a gate insulating film 16. An upper part and a side part of each of the electrodes 19 for charge transfer are insulated by an insulating film 17 made of, for example, $SiO_2$. An n-type impurity region 28 is provided in the silicon substrate 11 beneath each of the electrodes 19 and works so as to configure a vertical transfer (CCD) resistor.

The insulating film 17 is provided on each of the electrodes 19, and a shading film 22 made of, for example, aluminum is covered on this insulating film 17. This is made for the purpose of preventing the generation of noises called smear. An insulating and transparent flattening layer 21 is formed on this shading film 22. The device surface is flattened by a CMP (chemical mechanical polishing) method or other methods. The foregoing light receiving window part 15 partitions the flattening layer 21 and the shading film 22 by an opened portion. In this way, it is possible to form the sensor part 20 (imaging device array) having the solid-state imaging device pij of M pixels×N pixels and the electrodes 19, with the entire surface in an upper part of the device being flattened, on the silicon substrate 11.

Figure 5:
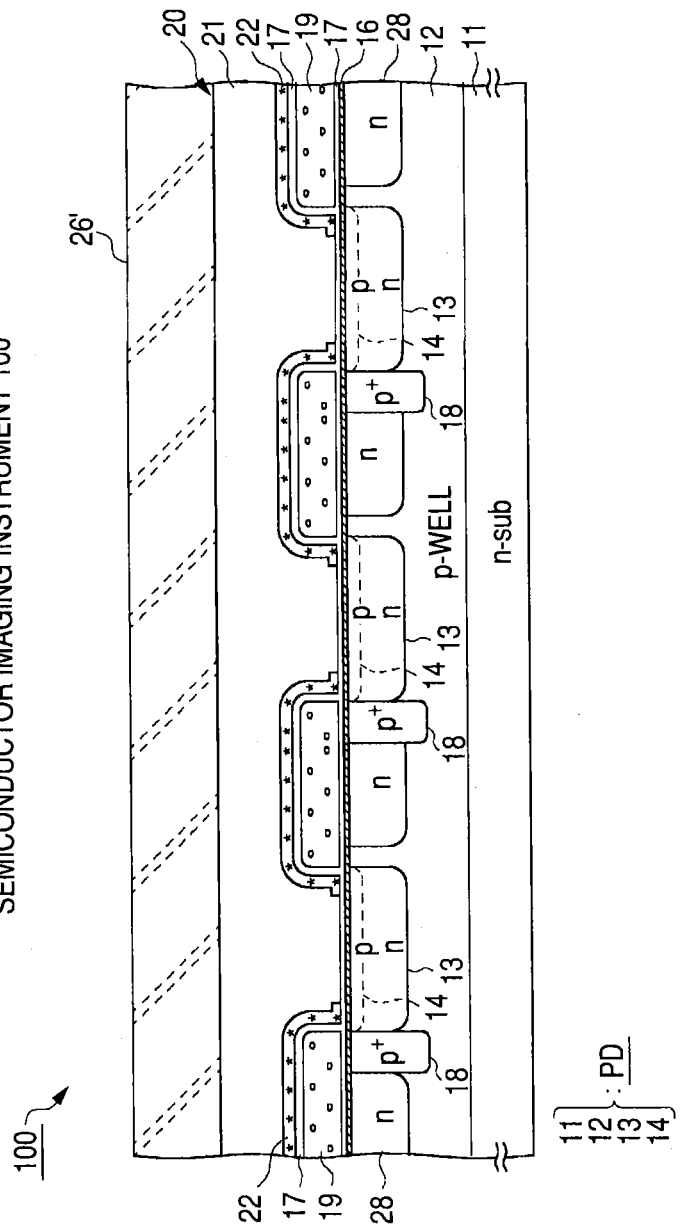
FIG. 5 is a process diagram of a formation example (No. 2) of a semiconductor imaging instrument 100 thereof.

Then, a color filter layer 26 for, for example, green color is formed in an upper part of a desired pixel of the sensor part 20 which is formed on the silicon substrate 11 as illustrated in FIG. 5 and flattened. On this occasion, a mixture in which a visible light absorbing dye material and an infrared light absorbing dye material are dispersed in a prescribed proportion in a desired resist material is used. For example, the color filter layer 26 is formed by coating a negative working photoresist liquid (mixture) that is formed by adding a visible light absorbing dye and an infrared light absorbing dye and patterning this photoresist layer 26'. With respect to the material composition ratio of the color filter layer 26, the negative working photoresist accounts for 50 wt %, whereas the visible light absorbing dye accounts for 25 wt % and the infrared light absorbing dye accounts for 25 wt %, respectively.

Figure 6:
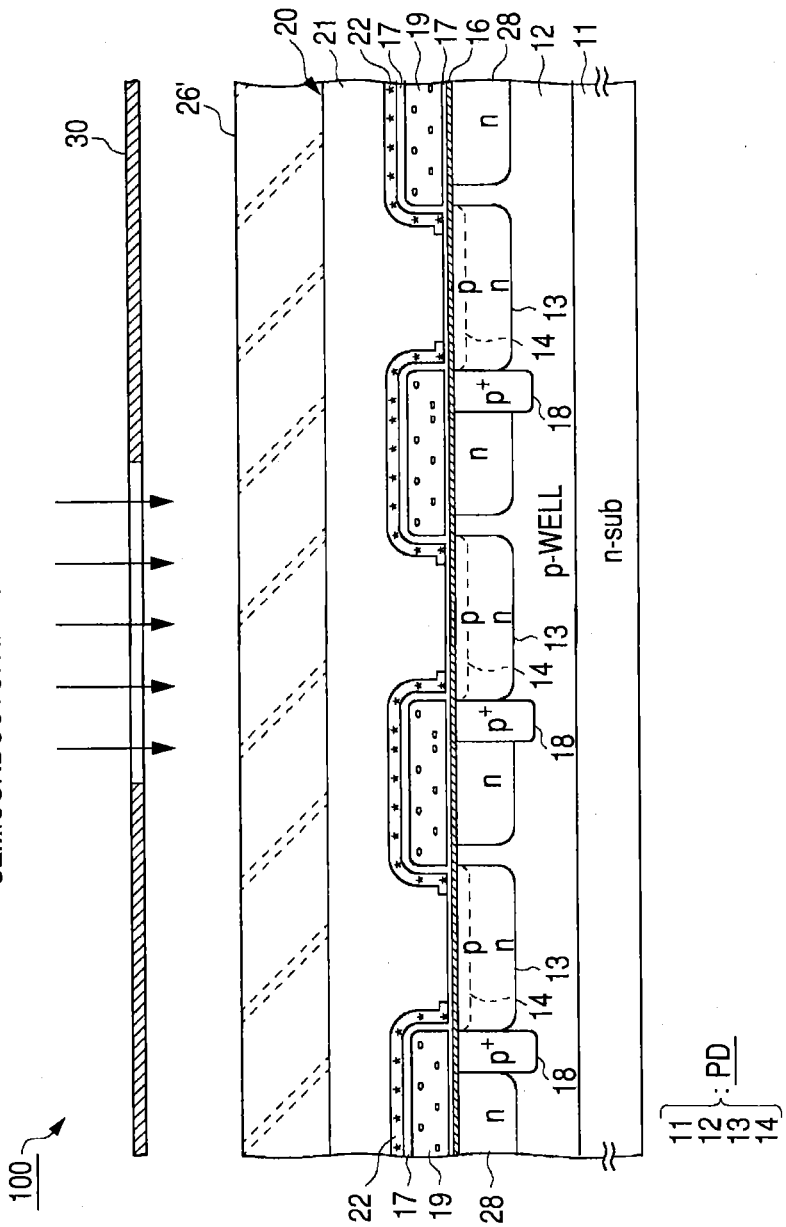
FIG. 6 is a process diagram of a formation example (No. 3) of a semiconductor imaging instrument 100 thereof.

Then, in FIG. 6, the negative working photoresist layer 26' on the silicon substrate 11 is exposed to light by using an exposure unit such as a stepper. At that time, a mask is formed by a reticle (dry plate) such that the color filter layer 26 does not remain on the sensor part 20 and the bonding pad part 24. In this example, an i-line stepper was used.

Figure 7:
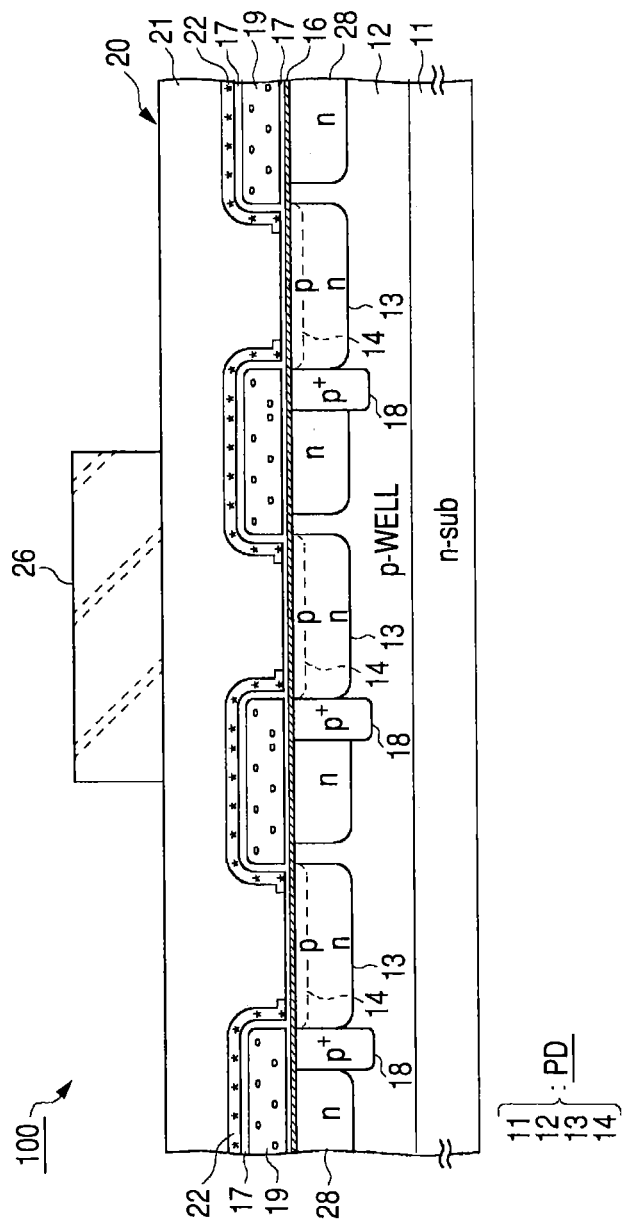
FIG. 7 is a process diagram of a formation example (No. 4) of a semiconductor imaging instrument 100 thereof.

Thereafter, in FIG. 7, after developing the negative working photoresist layer 26', a baking treatment is carried out at a prescribed temperature. In this way, it is possible to form the color filter layer 26 for green color containing an infrared light absorbing dye on a prescribed pixel of the sensor part 20 as illustrated in FIG. 7. Such a treatment is repeatedly carried out in the same manner with respect to color filter layers for other colors.

Figure 8:
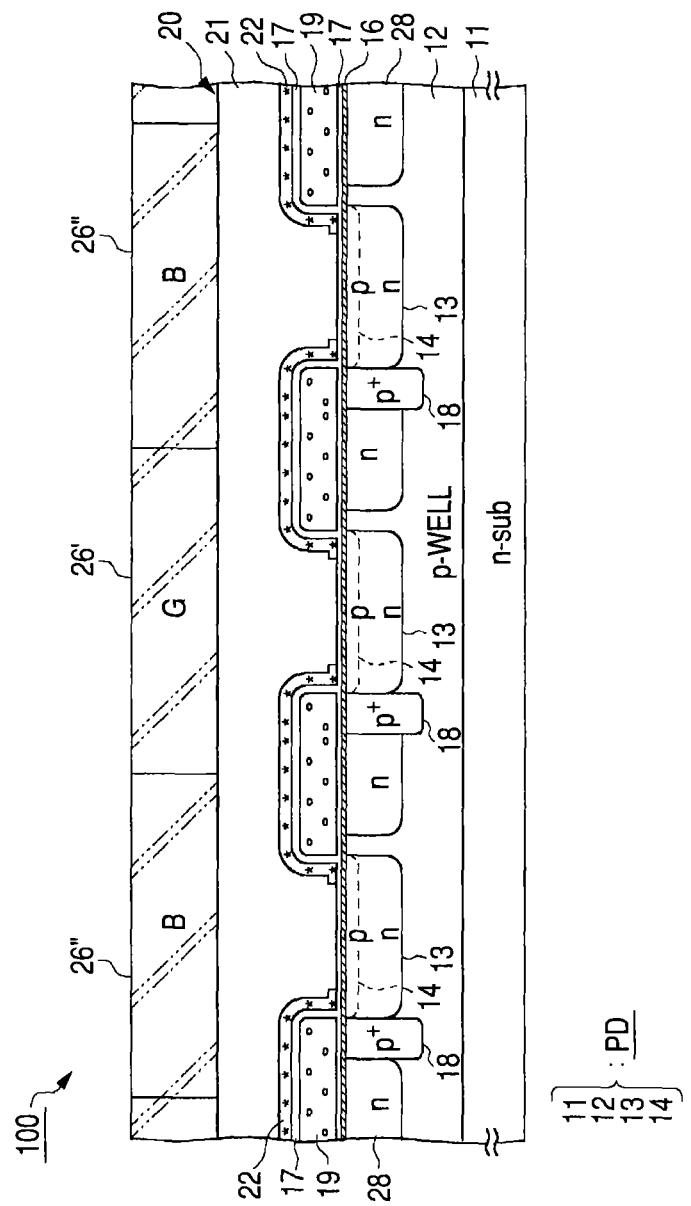
FIG. 8 is a process diagram of a formation example (No. 5) of a semiconductor imaging instrument 100 thereof.

For example, in FIG. 8, in the case where a color filter layer 26" for blue color is formed in both sides while putting the color filter layer 26 for green color therebetween, a negative working photoresist liquid (mixture) that is formed by adding a visible light absorbing dye for blue color and an infrared light absorbing dye for blue color is coated, and this photoresist layer 26" is formed by patterning upon exposure to light, development and heat treatment. In this way, as illustrated in FIG. 8, the color filter layer 26" for blue color, as shown by double broken lines in the drawing, can be formed in both sides of the color filter layer 26 for green color, as shown by double broken lines in the drawing. With respect to a manufacturing method of a color filter layer for red color, its explanation is omitted.

Figure 9:
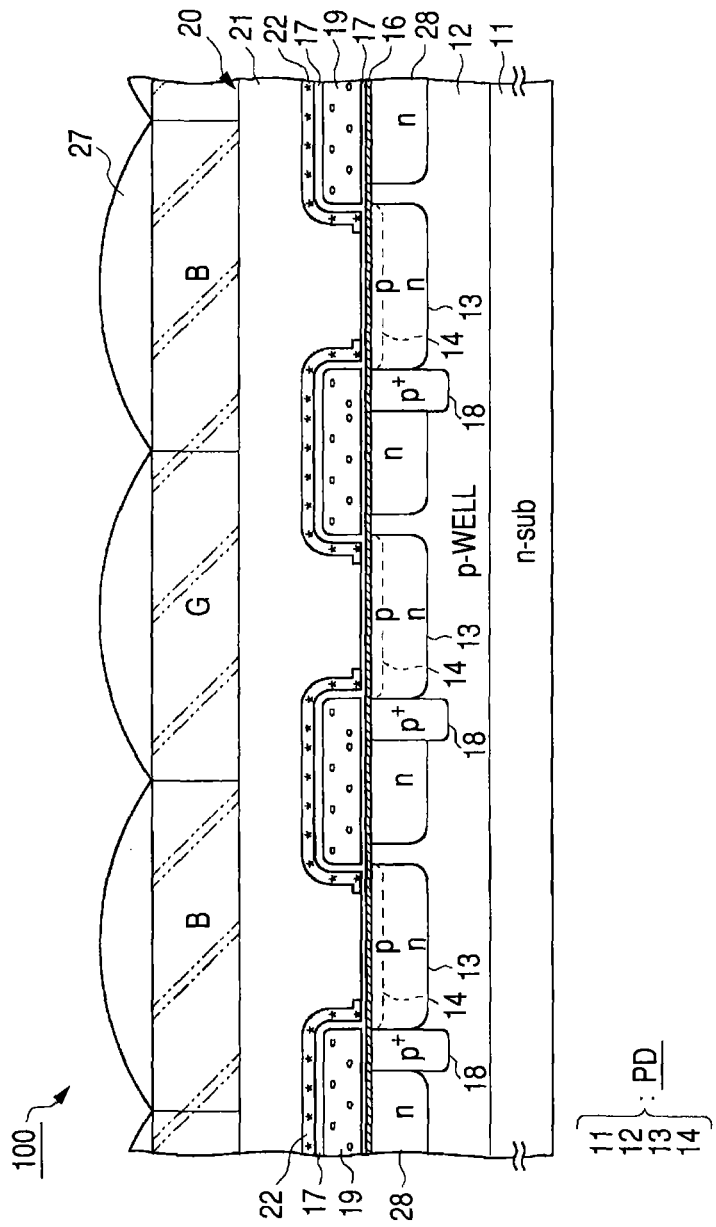
FIG. 9 is a process diagram of a formation example (No. 6) of a semiconductor imaging instrument 100 thereof.

Thereafter, a substantially hemispherical, on-chip lens (microlens) 27 is formed on each of the color filter layers 26 and 26" and the like in an usual technology as illustrated in FIG. 9. In this way, a semiconductor imaging instrument 100 in which one pixel has the solid-state imaging device pij as illustrated in FIG. 2 can be formed.

As shown in FIG. 10, the manufacturing method of a camera according to this embodiment includes the steps of setting up an optical system 110 for executing image formation of image light (incident light) from a subject on an imaging surface of a semiconductor imaging instrument 100 setting up a shutter unit 111 having a function to control a light irradiation period to the semiconductor imaging instrument 100 and a shading period, setting up a drive circuit 112 having a function to feed a drive signal for controlling a transfer operation of the semiconductor imaging instrument 100 and a shutter operation of the shutter unit 111, and setting up a signal processing circuit 113.

By a drive signal (timing signal) fed from the drive circuit 112, charge transfer of the semiconductor imaging instrument 100 is carried out. The signal processing circuit 113 executes various signal processings. An image signal that has been subjected to signal processing is stored in a recording medium, such as memories, or is outputted into a monitor.

In light of the above, according to the manufacturing method of a semiconductor imaging instrument as the example, it has become possible to manufacture the color filter function-provided semiconductor imaging instrument 100 and camera, each of which is provided with low transmissibility of infrared light, as required for an infrared light cutting function, in addition to high transmissibility of visible light as required for a color filter function.

In addition, it has become possible to omit a formation process of an infrared light cutting filter layer as formed separately from the color filter layer 26 and to design so as to shorten the operation time in a semiconductor wafer process and to reduce the materials to be used, thereby lowering the manufacturing costs. Furthermore, it has become possible to achieve the miniaturization (thinning to 1 to 3 mm) of a camera optical system without increasing manufacturing processes or materials to be used.

Incidentally, while in the foregoing example, the case of using a cyanine based dye represented by formula (2) for the infrared light absorbing dye material has been described, it should not be construed that the invention is limited thereto. A squalium based dye represented by formula (3) may be useful, too.

The invention can be extremely suitably applied to a semiconductor imaging instrument and a camera, each of which is provided with a solid-state imaging device or a field effect imaging device each having light receiving sensitivity to not only visible light but also infrared light.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor imaging instrument comprising:
a prescribed substrate;
an imaging device array produced on the substrate and having plural semiconductor imaging devices and electrodes for outputting a signal charge upon photoelectric conversion of received light;
a color filter layer provided on the imaging device array; and
an infrared light absorbing dye being contained in the color filter layer,
wherein a cyanine based dye which is configured by the following formula is used as the infrared light absorbing dye material:

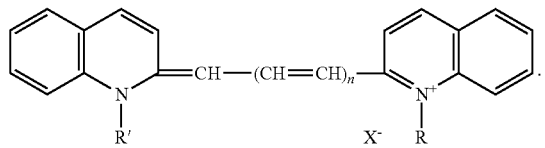

2. The semiconductor imaging instrument according to claim 1, wherein the color filter layer comprises a mixture in which a visible light absorbing dye material and the infrared light absorbing dye material are dispersed in a prescribed proportion.

3. An electronic apparatus comprising the semiconductor imaging instrument according to claim 1.

4. The electronic apparatus according to claim 3, wherein the electronic apparatus is a camera.

5. The semiconductor imaging instrument according to claim 1, wherein a flattening film is provided between each of the semiconductor imaging devices and the color filter.

6. The semiconductor imaging instrument according to claim 5, wherein the color filter is formed on each of the flattening films.

7. The semiconductor imaging instrument according to claim 1, wherein the color filter is provided between each of the semiconductor imaging devices and an on-chip lens corresponding to each of the semiconductor imaging devices.

8. The semiconductor imaging instrument according to claim 1, wherein each of the on-chip lenses is formed on the color filter.

9. The semiconductor imaging instrument according to claim 1, wherein the infrared light absorbing dye contains 25 wt % of the infrared light absorbing dye material.

10. The semiconductor imaging instrument according to claim 1, wherein the infrared light absorbing dye contains 25 wt % of a visible light absorbing dye material.

11. The semiconductor imaging instrument according to claim 9, wherein the infrared light absorbing dye contains 25 wt % of a visible light absorbing dye material.

12. The semiconductor imaging instrument according to claim 1, wherein R and R' are each $(CH_3)_2$.

13. The semiconductor imaging instrument according to claim 1, wherein $X^-$ represents a halogen anion.

14. The semiconductor imaging instrument according to claim 13, wherein $X^-$ is $ClO_4^-$.

15. The semiconductor imaging instrument according to claim 1, wherein n is equal to 0.

16. The semiconductor imaging instrument according to claim 1, wherein n is equal to 1.

17. The semiconductor imaging instrument according to claim 1, wherein n is equal to 2.

* * * * *